(12) United States Patent
Sun et al.

(10) Patent No.: US 12,446,456 B2
(45) Date of Patent: Oct. 14, 2025

(54) DOUBLE-SIDED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventors: Leitao Sun, Hubei (CN); Can Huang, Hubei (CN); Chunpeng Zhang, Hubei (CN); Wenxu Xianyu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/759,374

(22) PCT Filed: Jul. 13, 2022

(86) PCT No.: PCT/CN2022/105323
§ 371 (c)(1),
(2) Date: Jul. 24, 2022

(87) PCT Pub. No.: WO2024/000653
PCT Pub. Date: Jan. 4, 2024

(65) Prior Publication Data
US 2024/0215429 A1 Jun. 27, 2024

(30) Foreign Application Priority Data

Jun. 28, 2022 (CN) .......................... 202210753485.6

(51) Int. Cl.
*H10K 77/10* (2023.01)
*H10K 59/121* (2023.01)
(Continued)

(52) U.S. Cl.
CPC ....... *H10K 77/111* (2023.02); *H10K 59/1213* (2023.02); *H10K 59/122* (2023.02); *H10K 59/128* (2023.02); *H10K 59/873* (2023.02)

(58) Field of Classification Search
CPC ............. H10K 77/111; H10K 59/1213; H10K 59/122; H10K 59/128; H10K 59/873; H10K 59/123; H10K 59/121; H10H 29/142
See application file for complete search history.

(56) References Cited

U.S. PATENT DOCUMENTS 10,529,789 B2 * 1/2020 Kim ...................... H10K 59/128
11,996,396 B2 * 5/2024 Jeon ...................... H10D 86/411
(Continued)

FOREIGN PATENT DOCUMENTS

CN 107833904 A 3/2018
CN 107863368 A 3/2018
(Continued)

OTHER PUBLICATIONS

Chinese Office Action issued in corresponding Chinese Patent Application No. 202210753485.6 dated May 14, 2024, pp. 1-9.
(Continued)

Primary Examiner — J. E. Schoenholtz
(74) Attorney, Agent, or Firm — PV IP PC; Wei Te Chung

(57) ABSTRACT

The present application discloses a display panel, wherein the driving circuit layer includes a first transistor and a second transistor, the first light-emitting unit is arranged on a side of the driving circuit layer away from the flexible substrate, and is connected to the first transistor, and the first light-emitting unit emits light from a side away from the flexible substrate; wherein the second light-emitting unit is disposed on a side of the flexible substrate away from the
(Continued)

driving circuit layer, and is connected to the second transistor through a connection hole penetrating through the flexible substrate, and the second light-emitting unit emits light from a side away from the flexible substrate.

19 Claims, 3 Drawing Sheets

(51) Int. Cl.
  *H10K 59/122* (2023.01)
  *H10K 59/128* (2023.01)
  *H10K 59/80* (2023.01)

(56) References Cited

U.S. PATENT DOCUMENTS

| | | | |
|---|---|---|---|
| 12,089,454 B2* | 9/2024 | Cao | H10K 59/128 |
| 2004/0195959 A1 | 10/2004 | Park et al. | |
| 2019/0081122 A1* | 3/2019 | Kim | H10K 59/38 |
| 2020/0211455 A1* | 7/2020 | Yang | H10K 71/00 |
| 2024/0032352 A1* | 1/2024 | Cao | H10K 59/8792 |
| 2024/0047628 A1* | 2/2024 | Hu | H10K 71/50 |

FOREIGN PATENT DOCUMENTS

| | | |
|---|---|---|
| CN | 109671748 A | 4/2019 |
| CN | 109997230 A | 7/2019 |
| CN | 112086488 A | 12/2020 |
| CN | 112750965 A | 5/2021 |
| CN | 113097286 A | 7/2021 |
| CN | 113571560 A | 10/2021 |
| CN | 114613752 A | 6/2022 |
| WO | 2019071759 A1 | 4/2019 |
| WO | 2020154875 A1 | 8/2020 |

OTHER PUBLICATIONS

Chinese Office Action issued in corresponding Chinese Patent Application No. 202210753485.6 dated Jul. 3, 2024, pp. 1-7.
International Search Report in International application No. PCT/CN2022/105323, mailed on Dec. 16, 2022.
Written Opinion of the International Search Authority in International application No. PCT/CN2022/105323, mailed on Dec. 16, 2022.

* cited by examiner

DOUBLE-SIDED DISPLAY PANEL

BACKGROUND OF INVENTION

Field of Invention

The present application relates to the field of display technology, and in particular, to a display panel.

Description of Prior Art

At present, the display panel is mainly single-sided display, but in some special occasions and fields, a double-sided display panel will be used. For example, in playback facilities such as digital signage, window inquiry facilities, large-scale event venues, and outdoor advertisements, it is often necessary to view the display screen from both front and back sides of the display panel at the same time. In the existing display panel, two display screens are usually integrated together by means of modules to achieve double-sided display, which is costly and is not conducive to realizing the light weighting and thinning of the display panel.

SUMMARY OF INVENTION

The present application provides a display panel to solve the technical problem of the high cost of the double-sided display panel in the prior art, which is not conducive to light weighting and thinning.

The present application provides a display panel, which includes:

a flexible substrate;

a driving circuit layer disposed on the flexible substrate, wherein the driving circuit layer includes a first transistor and a second transistor;

a first light-emitting unit disposed on a side of the driving circuit layer away from the flexible substrate, wherein the first light-emitting unit is connected to a first source electrode or a first drain electrode of the first transistor, and the first light-emitting unit emits light from a side away from the flexible substrate; and a second light-emitting unit disposed on the side of the flexible substrate away from the driving circuit layer, wherein the second light-emitting unit is connected to a second source electrode or a second drain electrode of the second transistor through a connection hole penetrating through the flexible substrate, and the second light-emitting unit emits light from a side away from the flexible substrate.

Optionally, in this embodiment of the present application, along a direction of the flexible substrate toward the first light-emitting units, the driving circuit layer includes an active layer, a gate insulating layer, a first metal layer, an interlayer insulating layer, and a second metal layer; and wherein the active layer includes a first active layer and a second active layer arranged spaced apart from each other, the first metal layer includes a first gate electrode and a second gate electrode spaced apart from each other, the first gate electrode is disposed corresponding to the first active layer, the second gate electrode is disposed corresponding to the second active layer, and the second metal layer includes the first source electrode, the first drain electrode, the second source electrode, and the second drain electrode, the first source electrode and the first drain electrode are respectively connected to the first active layer, and the second source electrode and the second drain electrode are respectively connected to the second active layer.

Optionally, in this embodiment of the present application, the interlayer insulating layer has a plurality of contact holes and the connection hole, each of the contact holes penetrates through the interlayer insulating layer and extends to the a side of the active layer away from the flexible substrate, each of the contact holes exposes a surface of the active layer on a side away from the flexible substrate, and the connection hole penetrates through the interlayer insulating layer and extends to the a side of the flexible substrate away from the driving circuit layer; and wherein the first source electrode and the first drain electrode are respectively connected to the first active layer through corresponding ones of the contact holes, the second source electrode and the second drain electrode are respectively connected to the second active layer through corresponding ones of the contact holes, and the second source electrode or the second drain electrode is connected to each of the second light-emitting units through the connection hole.

Optionally, in this embodiment of the present application, the first light-emitting unit is an LED chip or an OLED light-emitting unit, and the second light-emitting unit is the LED chip or the OLED light-emitting unit.

Optionally, in this embodiment of the present application, the first light-emitting unit and the second light-emitting unit are both LED chips, and the display panel further includes a planarization layer, a third metal layer, a buffer layer, and a fourth metal layer; and wherein the planarization layer is disposed on a side of the second metal layer away from the flexible substrate, the planarization layer is provided with a via hole, the via hole exposes a surface the first source electrode or the first drain electrode on a side away from the flexible substrate, the third metal layer is disposed on the planarization layer, the third metal layer includes a first pad and a second pad, the first pad is connected to the first source electrode or the first drain electrode through the via hole, the first light-emitting unit is connected to the first pad and the second pad; the buffer layer is disposed on a side of the flexible substrate away from the driving circuit layer, the fourth metal layer is disposed on a side of the buffer layer away from the flexible substrate, the fourth metal layer includes a third pad and a fourth pad, the third pad is connected to the second source electrode or the second drain electrode, and the second light-emitting unit is connected to the third pad and the fourth pad.

Optionally, in this embodiment of the present application, each of the LED chips includes two connection electrodes, each of the first pad, the second pad, the third pad, and the fourth pad are respectively connected to a corresponding one of the connection electrodes through conductive adhesive or metal bonding.

Optionally, in this embodiment of the present application, the first light-emitting unit is an OLED light-emitting unit, the second light-emitting unit is an LED chip, the display panel further includes a planarization layer and a pixel definition layer, and the first light-emitting unit includes an anode, a light-emitting layer, and a cathode; and wherein the planarization layer is disposed on a side of the second metal layer away from the flexible substrate, the planarization layer is provided with a via hole, the via hole exposes a surface the first source electrode or the first drain electrode on a side away from the flexible substrate, the anode is disposed on the planarization layer, the anode is connected to the first source electrode or the first drain electrode through the via hole, the pixel definition layer is disposed on a side of the anode away from the flexible substrate, the pixel definition layer has an opening, the opening exposes a surface of the anode on a side away from the flexible substrate, the light-emitting layer is disposed within the opening, and the cathode is disposed on a side of the light-emitting layer away from the flexible substrate.

Optionally, in this embodiment of the present application, the first light-emitting unit is an LED chip, the second light-emitting unit is an OLED light-emitting unit, the display panel further includes a buffer layer and a first pixel definition layer, and the second light-emitting unit includes an anode, a light-emitting layer, and a cathode; and wherein the buffer layer is disposed on the side of the flexible substrate away from the driving circuit layer, the anode is disposed on the buffer layer, and the anode is connected to the second source electrode or the second source electrode through the connection hole, the pixel definition layer is disposed on a side of the anode away from the flexible substrate, the pixel definition layer has an opening, the opening exposes a surface of the anode on a side away from the flexible substrate, the light-emitting layer is arranged within the opening, and the cathode is disposed on a side of the light-emitting layer away from the flexible substrate.

Optionally, in this embodiment of the present application, the driving circuit layer further includes an insulating layer and a fifth metal layer; and wherein the insulating layer is disposed on a side of the first metal layer away from the flexible substrate, the fifth metal layer is arranged between the insulating layer and the interlayer insulating layer, the fifth metal layer is disposed between the insulating layer and the interlayer insulating layer, the fifth metal layer includes a first electrode and a second electrode, the first electrode is disposed corresponding to the first gate electrode, and the second electrode is disposed corresponding to the second gate electrode.

Optionally, in this embodiment of the present application, the display panel further includes a protective layer, a first insulating layer, a second insulating layer, a first encapsulation layer, and a second encapsulation layer; and wherein, along a direction of the flexible substrate toward the first light-emitting unit, the protective layer, the first insulating layer, and the second insulating layer are sequentially stacked between the flexible substrate and the driving circuit layer; the first encapsulation layer is disposed on the side of the first light-emitting unit away from the flexible substrate and covers the first light-emitting unit, and the second encapsulation layer is disposed on the side of the second light-emitting unit away from the flexible substrate and covers the second light-emitting unit.

Optionally, in this embodiment of the present application, the display panel includes a plurality of the first light-emitting units and a plurality of the second light-emitting units, and the driving circuit layer includes a plurality of the first transistors and a plurality of the second transistors, each of the first transistors is connected to at least one of the first light-emitting units, and each of the second transistors is connected to at least one of the second light-emitting units.

Optionally, in this embodiment of the present application, the plurality of the first light-emitting units are arranged in an array, the plurality of the second light-emitting units are arranged in an array, and at least one of the first light-emitting units are disposed between every adjacent two of the second light-emitting units.

The present application also provides a display panel, which includes:
a flexible substrate;
a driving circuit layer disposed on the flexible substrate, wherein the driving circuit layer includes a plurality of first transistors and a plurality of second transistors;
a plurality of first light-emitting units disposed on a side of the driving circuit layer away from the flexible substrate, wherein each of the first light-emitting units is connected to a first source electrode or a first drain electrode of a corresponding one of the first transistors, and the first light-emitting units emit light from a side away from the flexible substrate; and
a plurality of second light-emitting units disposed on a side of the flexible substrate away from the driving circuit layer, wherein each of the second light-emitting units is connected to a second source electrode or a second drain electrode of a corresponding one of the second transistors through a connection hole penetrating through the flexible substrate, and the second light-emitting units emit light from a side away from the flexible substrate, and
wherein each of the first light-emitting units is an LED chip or an OLED light-emitting unit, each of the second light-emitting units is the LED chip or the OLED light-emitting unit, and at least one of the first light-emitting units is disposed between every adjacent two of the second light-emitting units.

The present application discloses a display panel. Since the first light-emitting unit and the second light-emitting unit are respectively disposed on opposite sides of the flexible substrate, and the second light-emitting unit is connected to the driving circuit layer through the connection hole penetrating through the flexible substrate, so that the first light-emitting unit and the second light-emitting unit can respectively emit light toward the opposite sides of the flexible substrate without special film structure design or film material improvement, thereby reducing the difficulty of the manufacturing process. In addition, since the driving circuit layer is arranged on one side of the flexible substrate, and the first light-emitting unit and the second light-emitting unit are driven by the same driving circuit layer, compared with the prior art solution in which two display screens are integrated by means of modules, one substrate and one driving circuit layer are at least saved, which effectively reduces the production cost and facilitates the realization of the lightweighting and thinning of the display panel.

BRIEF DESCRIPTION OF DRAWINGS

In order to more clearly illustrate the technical solutions of the embodiments of the present application, the drawings illustrating the embodiments will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The technical solutions in the embodiments of the present application will be clearly and completely described below. Obviously, the described embodiments are only a part of the embodiments of the present application, but not all of the embodiments. Based on the embodiments in the present application, all other embodiments obtained by a person of ordinary skill in the art without creative efforts shall fall within the protection scope of the present application.

In the description of the present application, it should be understood that the terms "first" and "second" are only used for descriptive purposes, and cannot be interpreted as indicating or implying relative importance or implicitly indicating the number of indicated technical features. Thus, features defined as "first" and "second" etc. may expressly or implicitly include one or more of said features, and therefore should not be construed as limiting the present application.

The present application provides a display panel, which will be described in detail below. It should be noted that the description order of the following embodiments is not intended to limit the preferred order of the embodiments of the present application.

Figure 1:
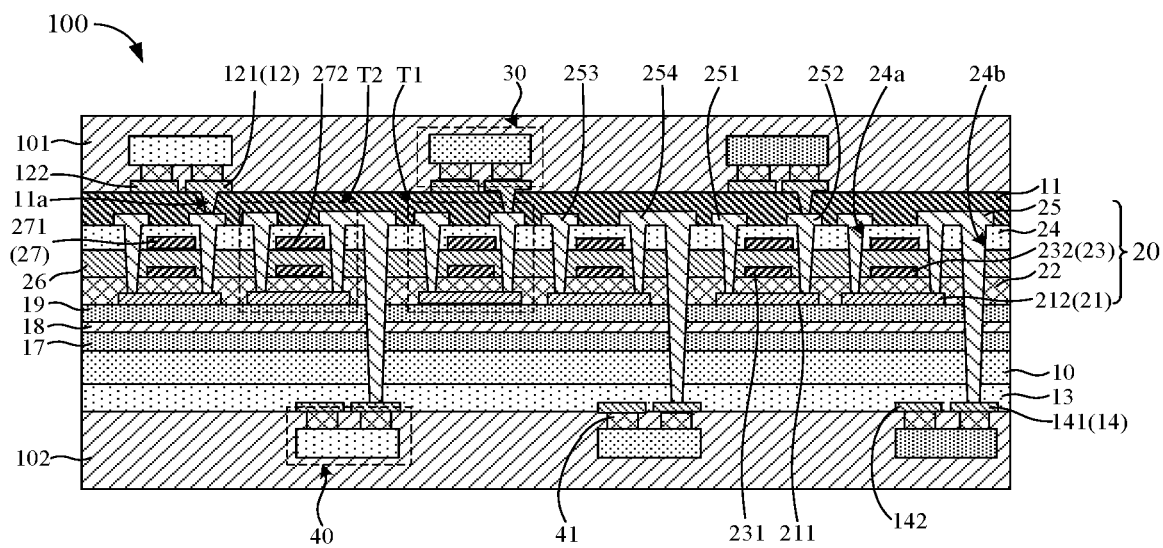
FIG. 1 is a first structural schematic diagram of a display panel provided by the present application.

Please refer to FIG. 1, which is a first structural schematic diagram of a display panel provided by the present application. In an embodiment of the present application, the display panel 100 includes a flexible substrate 10, a driving circuit layer 20, a first light-emitting unit 30, and a second light-emitting unit 40.

The driving circuit layer 20 is disposed on the flexible substrate 10. The driving circuit layer 20 includes a first transistor T1 and a second transistor T2. The first light-emitting unit 30 is disposed on a side of the driving circuit layer 20 away from the flexible substrate 10. The first light-emitting unit 30 is connected to the first source electrode 251 or the first drain electrode 252 of the first transistor T1. The first light-emitting unit 30 emits light from a side away from the flexible substrate 10. The second light-emitting unit 40 is disposed on the side of the flexible substrate 10 away from the driving circuit layer 20. The second light-emitting unit 40 is connected to the second source electrode 253 or the second drain electrode 254 of the second transistor T2 through the connection hole 24*b* penetrating through the flexible substrate 10. The second light-emitting unit 40 emits light from a side away from the flexible substrate 10.

In this embodiment of the present application, the driving circuit layer 20 is provided in the display panel 100, and the driving circuit layer 20 is configured to drive the first light-emitting unit 30 and the second light-emitting unit 40 respectively, and light-emitting directions of the first light-emitting unit 30 and the second light-emitting unit 40 are opposite to realize the double-sided display of the display panel 100.

In addition, since the first light-emitting unit 30 and the second light-emitting unit 40 are respectively disposed on opposite sides of the flexible substrate 10, and the second light-emitting unit 40 is connected to the driving circuit layer 20 through the connection hole 24*b* penetrating through the flexible substrate 10, so that the first light-emitting unit 30 and the second light-emitting unit 40 can respectively emit light toward the opposite sides of the flexible substrate 10 without special film structure design or film material improvement, thereby reducing the difficulty of the manufacturing process. In addition, since the driving circuit layer 20 is arranged on one side of the flexible substrate 10, and the first light-emitting unit 30 and the second light-emitting unit 40 are driven by the same driving circuit layer 20, compared with the prior art solution in which two display screens are integrated by means of modules, one substrate (e.g., a flexible substrate) and one driving circuit layer are at least saved, which effectively reduces the production cost and facilitates the realization of the lightness and thinness of the display panel 100.

In this embodiment of the present application, the flexible substrate 10 may include one layer, two layers, or more than two layers of flexible polyimide (PI). The flexible substrate 10 may also be made of materials such as resin. The flexible substrate 10 mainly plays a role of carrying and protecting the driving circuit layer 20 to improve the structural stability of the display panel 100.

In an embodiment of the present application, the driving circuit layer 20 is configured to provide the first light-emitting unit 30 and the second light-emitting unit 40 with driving signals, such as a driving voltage, a power supply voltage, and the like. The driving circuit layer 20 includes, but is not limited to, a first transistor T1 and a second transistor T2. For example, in order to compensate for the threshold voltage shift or mobility shift of the transistors, the driving circuit layer 20 may include 3 transistors and 1 capacitor (3T1C), 4 transistors and 2 capacitors (4T2C), 7 transistors and 1 capacitor (7T1C), and other pixel driving circuits for driving the first light-emitting unit 30 or the second light-emitting unit 40. The specific structure of the above-mentioned pixel driving circuit can be referred to the prior art, which is not repeated herein for brevity. The embodiments of the present application only take the first transistor T1 and the second transistor T2 as examples to describe the connection relationship between the driving circuit layer 20 and the first light-emitting unit 30 and the second light-emitting unit 40, which should not be understood as a limitation to the present application.

In this embodiment of the present application, the first transistor T1 and the second transistor T2 may be thin film transistors, field effect transistors, or other devices with the same characteristics. Since the source and drain of the transistor used here are symmetrical, the source and drain are interchangeable. In addition, the transistors used in the embodiments of the present application may include P-type transistors and/or N-type transistors, wherein the P-type transistor is turned on when a gate is at a low power level, and is turned off when the gate is at a high power level, while the N-type transistor is turned on when a gate is at a high power level, and is turned off when the gate is at a low power level.

In this embodiment of the present application, the first transistor T1 and the second transistor T2 may be low temperature polysilicon thin film transistors, oxide semiconductor thin film transistors, or amorphous silicon thin film transistors. The transistors in the driving circuit layer 20 provided by the embodiments of the present application are all of the same type of transistors, so that the manufacturing process can be simplified, and the driving circuit layer 20 can be prevented from driving abnormally caused by differences between different types of transistors.

In this embodiment of the present application, the first light-emitting unit 30 and the second light-emitting unit 40 may be LED chips, OLED light-emitting units, quantum dot light-emitting devices, and the like. For example, the first light-emitting unit 30 and the second light-emitting unit 40 are both LED chips. Alternatively, both the first light-emitting unit 30 and the second light-emitting unit 40 are OLED light-emitting units. Alternatively, the first light-emitting unit 30 is an LED chip, and the second light-emitting unit 40 is an OLED light-emitting unit or the like. Details will be described in the following embodiments, which will not be repeated herein for brevity.

In this embodiment of the present application, the display panel 100 may include a plurality of first light-emitting units 30 and a plurality of second light-emitting units 40. The driving circuit layer 20 includes a plurality of first transistors T1 and a plurality of second transistors T2. Each of the first transistors T1 is connected to at least one first light-emitting unit 30. Each of the second transistors T2 is connected to at least one second light-emitting unit 40.

It is appreciated that, in an embodiment of the present application, when the plurality of first transistors T1 are connected to the plurality of first light-emitting units 30 in a one-to-one correspondence, and the plurality of second transistors T2 are connected to the plurality of second light-emitting units 40 in a one-to-one correspondence, a first light-emitting unit 30 or a second light-emitting unit 40 can be regarded as a pixel. When each first transistor T1 is connected to two or more first light-emitting units 30, and each second transistor T2 is connected to two or two second light-emitting units 40, one pixel can include a plurality of first light-emitting units 30 or a plurality of second light-emitting units 40, thereby improving the brightness of the pixel.

The following embodiments of the present application are described by taking a first transistor T1 connected to a first light-emitting unit 30 and a second transistor T2 connected to a second light-emitting unit 40 as an example, which should not be construed as a limitation to the present application.

In an embodiment of the present application, still referring to FIG. 1, along a direction of the flexible substrate 10 toward the first light-emitting unit 30, the driving circuit layer 20 includes an active layer 21, a gate insulating layer 22, and a first metal layer. 23, an interlayer insulating layer 24, and a second metal layer 25 which are stacked.

Specifically, the active layer 21 is disposed on a side of the flexible substrate 10 close to the driving circuit layer 20. The active layer 21 includes a first active layer 211 and a second active layer 212 arranged at intervals. The gate insulating layer 22 is disposed on a side of the active layer 21 away from the flexible substrate 10. The gate insulating layer 22 covers the active layer 21. The first metal layer 23 is disposed on a side of the gate insulating layer 22 away from the flexible substrate 10. The first metal layer 23 includes a first gate electrode 231 and a second gate electrode 232 which are spaced apart. The first gate 231 is disposed corresponding to the first active layer 211. The second gate electrode 232 is disposed corresponding to the second active layer 212. The interlayer insulating layer 24 is disposed on a side of the first metal layer 23 away from the flexible substrate 10. The second metal layer 25 is disposed on a side of the interlayer insulating layer 24 away from the flexible substrate 10. The second metal layer 25 includes a first source electrode 251, a first drain electrode 252, a second source electrode 253, and a second drain electrode 254. The first source electrode 251 and the first drain electrode 252 are respectively connected to the first active layer 211. The second source electrode 253 and the second drain electrode 254 are respectively connected to the second active layer 212.

The contact connections between the first active layer 211 and the first source electrode 251 and the first drain electrode 252 are heavily doped regions. The contact connections between the second active layer 212 and the second source electrode 253 and the second drain electrode 254 are heavily doped regions.

The first transistor T1 includes a first active layer 211, a first gate electrode 231, a first source electrode 251, and a first drain electrode 252. The second transistor T2 includes a second active layer 212, a second gate electrode 232, a second source electrode 253, and a second drain electrode 254.

In an embodiment of the present application, the first transistor T1 and the second transistor T2 are arranged in the same layer, that is, each functional layer in the first transistor T1 is arranged in the same layer as a corresponding functional layer in the second transistor T2, which can simplify the manufacturing process, and reduce manufacturing cost. Meanwhile, it is beneficial to realize the lightweighting and thinning of the display panel 100.

Of course, in other embodiments of the present application, the first transistor T1 and the second transistor T2 may also be disposed in different layers. For example, the first transistor T1 and the second transistor T2 are both disposed on the side of the flexible substrate 10 close to the first light-emitting unit 30, but the first transistor T1 is located between the first light-emitting unit 30 and the second light-emitting unit 40. For another example, the first active layer 211 of the first transistor T1 and the second active layer 212 of the second transistor T2 may be disposed in the same layer, but other layers of the first transistor T1 and other layers of the second transistor T2 are disposed in different layers.

Further, in an embodiment of the present application, the interlayer insulating layer 24 has a plurality of contact holes 24*a* and connection holes 24*b*. Each contact hole 24*a* penetrates through the interlayer insulating layer 24 and extends to the side of the active layer 21 away from the flexible substrate 10. The contact hole 24*a* exposes a surface of the active layer 21 away from the flexible substrate 10. The connection hole 24*b* penetrates through the interlayer insulating layer 24 and extends to the side of the flexible substrate 10 away from the driving circuit layer 20.

The first source electrode 251 and the first drain electrode 252 are respectively connected to the first active layer 211 through corresponding contact holes 24*a*. The second source electrode 253 and the second drain electrode 254 are connected to the second active layer 212 through the corresponding contact holes 24*a*, respectively. One of the second source electrode 253 and the second drain electrode 254 is connected to the second light-emitting unit 40 through the connection hole 24*b*.

It should be noted that, the drawings in the embodiments of the present application all illustrate by taking as an example that the first light-emitting unit 30 is connected to the first drain 252 through the connection hole 24*b* and the second drain 254 is connected to the second light-emitting unit 40 through the connection hole 24*b*. However, it should not be construed as a limitation to the present application.

In an embodiment of the present application, the connection between the second light-emitting unit 40 and the second transistor T2 is realized by arranging deep holes, that is, the connecting holes 24*b*, penetrating through the functional layers such as the interlayer insulating layer 24 and the flexible substrate 10, thereby realizing the connection between the second light-emitting unit 40 and the second transistor T2, and realizing the driving of the second light-emitting unit 40 by the driving circuit layer 20, which ensures that the display panel 100 emits light normally from opposite sides of the display panel 100. In addition, the embodiments of the present application adopt the flexible substrate 10, and due to the material properties of the flexible substrate 10, when forming the connection holes 24b, the difficulty of the process can be reduced, and cracks can be avoided in the flexible substrate 10, thereby improving product quality.

In an embodiment of the present application, the first light-emitting unit 30 and the second light-emitting unit 40 are both LED chips. In an embodiment of the present application, a plurality of LED chips are arranged on opposite sides of the flexible substrate 10 in the display panel 100 by techniques such as mass transfer, which can reduce the difficulty of the process while realizing double-sided display.

When both the first light-emitting unit 30 and the second light-emitting unit 40 are LED chips, the display panel 100 further includes a planarization layer 11, a third metal layer 12, a buffer layer 13, and a fourth metal layer 14.

The planarization layer 11 is disposed on the side of the second metal layer 25 away from the flexible substrate 10. The planarization layer 11 is provided with a via hole 11a. The via hole 11a exposes a surface of the first source electrode 251 or the first drain electrode 252 away from the flexible substrate 10. The third metal layer 12 is provided on the planarization layer 11. The third metal layer 12 includes a first pad 121 and a second pad 122. The first pad 121 is connected to the first source electrode 251 or the first drain electrode 252 through the via hole 11a. The first light-emitting unit 30 is connected to the first pad 121 and the second pad 122 respectively. The buffer layer 13 is disposed on the side of the flexible substrate 10 away from the driving circuit layer 20. The fourth metal layer 14 is disposed on the side of the buffer layer 13 away from the flexible substrate 10. The fourth metal layer 14 includes a third pad 141 and a fourth pad 142. The third pad 141 is connected to one of the second source electrode 253 and the second drain electrode 254. The second light-emitting unit 40 is connected to the third pad 141 and the fourth pad 142, respectively.

Specifically, in an embodiment of the present application, the via hole 11a exposes a surface of the first drain electrode 252 away from the flexible substrate 10. The first pad 121 is connected to the first drain electrode 252 through the via hole 11a. The first light-emitting unit 30 is bonded and connected to the first transistor T1 through the first pad 121. The third pad 141 is connected to the second drain 254. The second light-emitting unit 40 is connected to the second transistor T2 through the third pad 141.

In an embodiment of the present application, the LED chip may be a millimeter light-emitting diode (Mini-LED) chip, a micro-light-emitting diode (Micro-LED) chip, or the like. Each LED chip includes two connection electrodes 41. Two connection electrodes 41 are deposited on a luminescent material layer. One of the connecting electrodes 41 is the positive electrode of the LED chip, and the other connecting electrode 41 is the negative electrode of the LED chip. Of course, the structure of the LED chip of an embodiment of the present application is not limited thereto.

Specifically, in the first light-emitting unit 30, one of the connection electrodes 41 is connected to the first pad 121, and the other connection electrode 41 is connected to the second pad 122. In the second light-emitting unit 40, one of the connection electrodes 41 is connected to the third pad 141, and the other connection electrode 41 is connected to the fourth pad 142.

In an embodiment of the present application, each of the first pad 121, the second pad 122, the third pad 141, and the fourth pad 142 is connected to a corresponding one of the connection electrodes 41 by metal bonding.

Metallic bonds are chemical bonds that connect atoms in metals together, and differ from covalent and ionic bonds, because electrons in metal bonding are delocalized, that is, they are not shared only between two atoms. Instead, electrons in metallic bonds float freely in the lattice of the metallic nucleus. This type of bonding imparts many unique material properties to metals, including excellent thermal and electrical conductivity, high melting point, and ductility. The metal bonding enables good electrical conductivity between the first pads 121, the second pads 122, the third pads 141, and the fourth pads 142 and the corresponding connection electrodes 41.

In the embodiments of the present application, the light-emitting material of the LED chip may be an inorganic light-emitting material such as gallium nitride, and quantum dots, or an organic light-emitting material. The LED chip can emit red light, blue light, green light, white light, or yellow light, etc. When making LED chips, different light-emitting materials can be selected according to different luminous color requirements.

In this embodiment of the present application, the driving circuit layer 20 may further include an insulating layer 26 and a fifth metal layer 27. The insulating layer 26 is disposed on a side of the first metal layer 23 away from the flexible substrate 10. The fifth metal layer 27 is disposed between the insulating layer 26 and the interlayer insulating layer 24. The fifth metal layer 27 includes a first electrode 271 and a second electrode 272. The first electrodes 271 is disposed corresponding to the first gate electrodes 231. The second electrode 272 is disposed corresponding to the second gate electrode 232.

The first electrode 271 and the first gate 231 constitute a bipolar plate of a storage capacitor. The second electrode 272 and the second gate 232 constitute another bipolar plate of the storage capacitor. In an embodiment of the present application, the first gate 231 (the second gate 232) is used as one pole of the storage capacitor, which can further simplify the process and reduce the thickness of the display panel 100.

In this embodiment of the present application, the display panel 100 may further include a protective layer 17, a first insulating layer 18, a second insulating layer 19, a first encapsulation layer 101, and a second encapsulation layer 102.

Along the direction of the flexible substrate 10 toward the first light-emitting unit 30, the protective layer 17, the first insulating layer 18, and the second insulating layer 19 are sequentially stacked and disposed between the flexible substrate 10 and the driving circuit layer 20. The first encapsulation layer 101 is disposed on the side of the first light-emitting unit 30 away from the flexible substrate 10 and covers the first light-emitting unit 30. The second encapsulation layer 102 is disposed on the side of the second light-emitting unit 40 away from the flexible substrate 10 and covers the second light-emitting unit 40.

The material of the protective layer 17 may be silicon oxide. The material of the first insulating layer 18 may be silicon nitride. The material of the second insulating layer 19 may be silicon oxide. The protective layer 17, the first insulating layer 18, and the second insulating layer 19 are configured to isolate the flexible substrate 10 from the driving circuit layer 20, and play the role of blocking water and oxygen. When the active layer 21 is subjected to high temperature treatment, the second insulating layer 19 also plays a role of heat preservation.

In an embodiment of the present application, the materials of the first encapsulation layer 101 and the second encapsulation layer 102 are generally transparent, so as to improve the light transmittance of the display panel 100. Specifically, the materials of the first encapsulation layer 101 and the second encapsulation layer 102 may be optical clear adhesive (OCA) or other transparent adhesives. In this embodiment of the present application, the transparent adhesives are used to form the first encapsulation layer 101 and the second encapsulation layer 102, which can improve the light-exiting efficiency of the display panel 100 on the one hand. On the other hand, since the first encapsulation layer 101 covers the first light-emitting unit 30 and the second encapsulation layer 102 covers the second light-emitting unit 40, the first light-emitting unit 30 and the second light-emitting unit 40 can be fixed and protected.

In an embodiment of the present application, the plurality of first light-emitting units 30 are arranged in an array, the plurality of second light-emitting units 40 are arranged in an array, and at least one first light-emitting unit 30 is disposed between every adjacent two of the second light-emitting units 40.

Specifically, one first light-emitting unit 30, two first light-emitting units 30, or more than two first light-emitting units 30 may be disposed between every adjacent two of the second light-emitting units 40. Of course, in other embodiments of the present application, the plurality of first light-emitting units 30 and the plurality of second light-emitting units 40 may also be arranged according to other rules, which are not limited in the present application.

As shown in FIG. 1, a first light-emitting unit 30 is disposed between every adjacent two of the second light-emitting units 40. That is, pixel resolutions of the display images on the front and back sides of the display panel 100 are equal.

Figure 2:
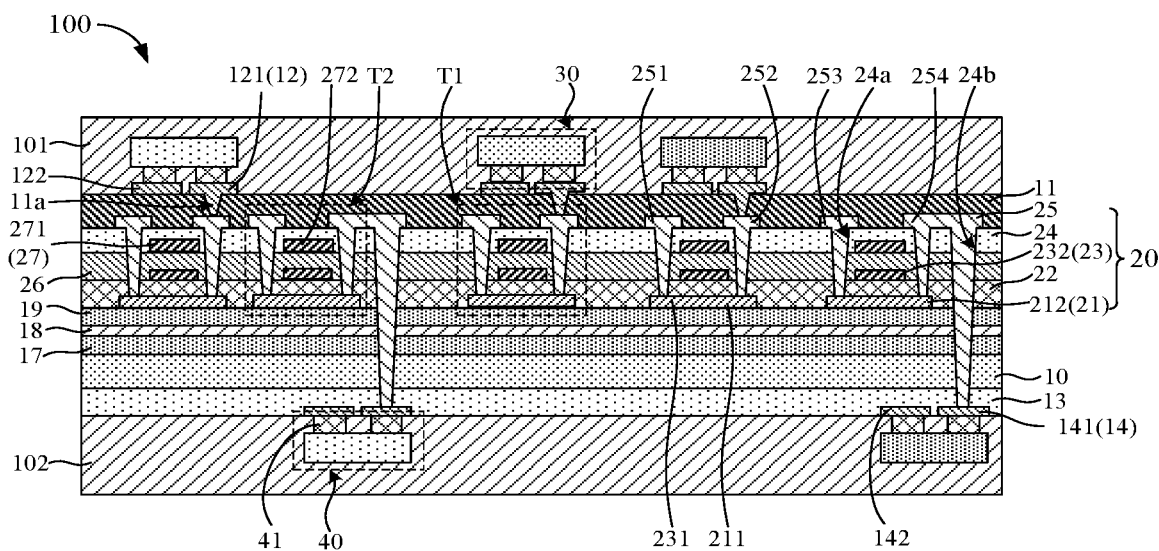
FIG. 2 is a second structural schematic diagram of the display panel provided by the present application.

Please refer to FIG. 2, which is a second structural schematic diagram of the display panel provided by the present application. The difference from the display panel 100 shown in FIG. 1 is that, in an embodiment of the present application, two first light-emitting units 30 are disposed between every adjacent two of the second light-emitting units 40. In this way, the pixel resolution of the side of the display panel 100 where the first light-emitting unit 30 is provided is greater than the pixel resolution of the side of the display panel 100 where the second light-emitting unit 40 is provided.

In other embodiments of the present application, at least two second light-emitting units 40 are disposed between every adjacent two of the first light-emitting units 30. In this way, the pixel resolution of the side of the display panel 100 where the first light-emitting unit 30 is provided is smaller than the pixel resolution of the side of the display panel 100 where the second light-emitting unit 40 is provided.

Figure 3:
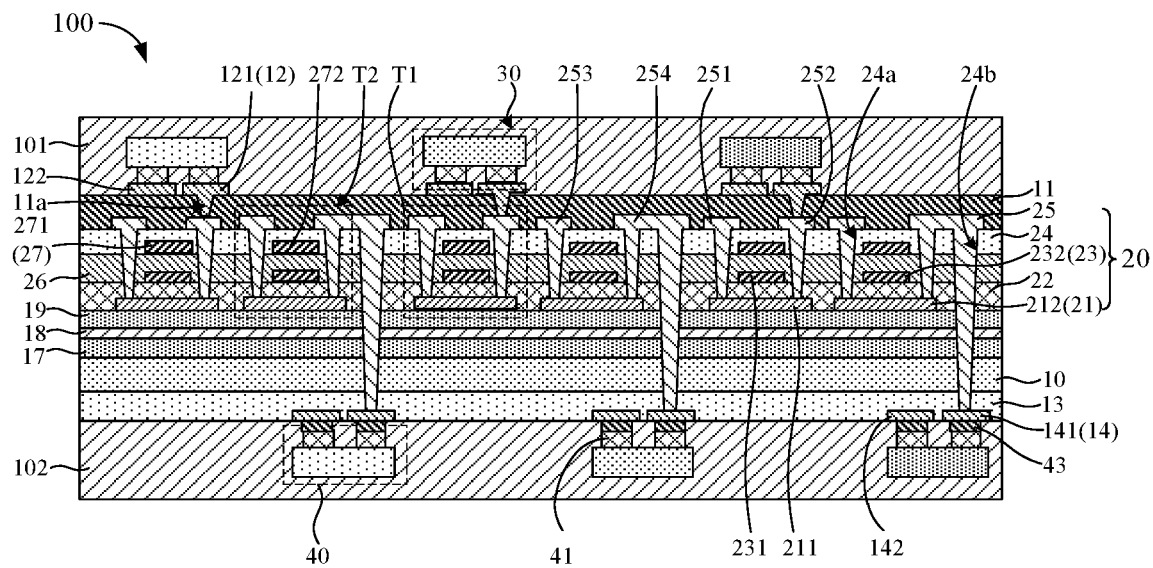
FIG. 3 is a third structural schematic diagram of a display panel provided by the present application.

Please refer to FIG. 3, which is a third structural schematic diagram of the display panel provided by the present application. The difference from the display panel 100 shown in FIG. 1 is that, in an embodiment of the present application, the first pad 121, the second pad 122, the third pad 141, and the fourth pad 142 are connected to the corresponding connection electrodes 41 by the conductive adhesive 43.

Specifically, the display panel 100 further includes the conductive adhesive 43. The material of the conductive adhesive 43 may be anisotropic conductive film (ACF). Using conductive particles in the anisotropic conductive adhesive film to connect the first pads 121, the second pads 122, the third pads 141 and the fourth pads 142 and the corresponding connection electrodes 41, the occurrence of short-circuit between adjacent pads or adjacent connection electrodes 41 can be prevented. When the conductive adhesive 43 is ACF, the conductive adhesive 43 can be disposed as a blanket layer. Of course, the conductive adhesive 43 can also be made of other conductive adhesive materials.

In other embodiments of the present application, the first pads 121, the second pads 122, the third pads 141, and the fourth pads 142 may also be connected to the corresponding connection electrodes 41 by other means such as fusion welding.

Figure 4:
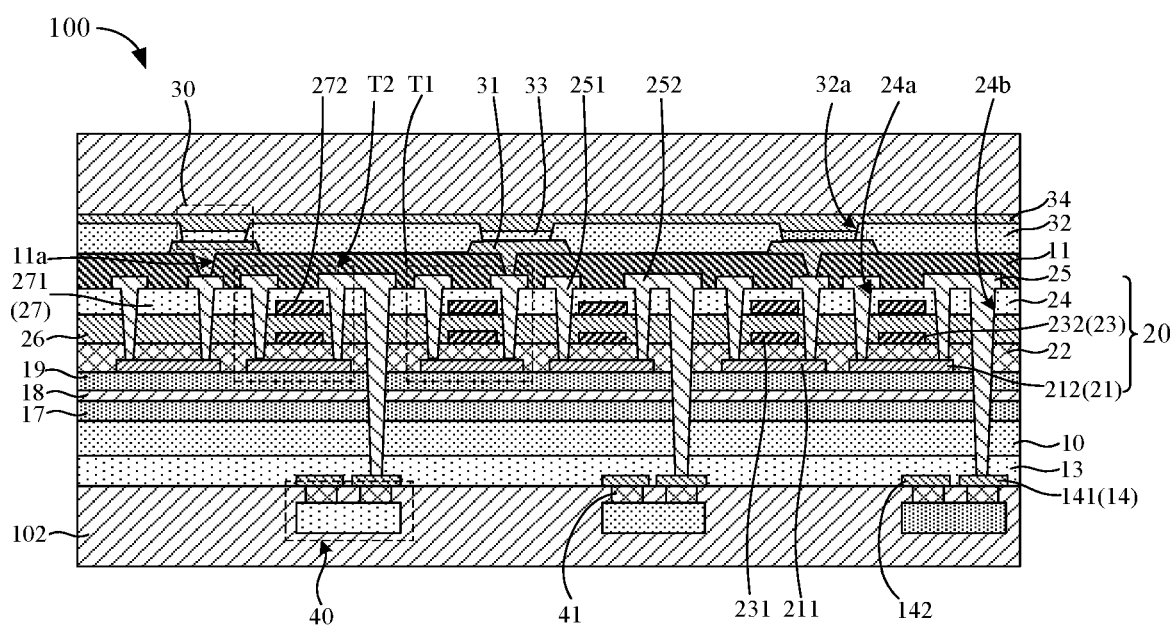
FIG. 4 is a fourth schematic structural diagram of a display panel provided by the present application.

Please refer to FIG. 4, which is a fourth structural schematic diagram of the display panel provided by the present application. The difference from the display panel 100 shown in FIG. 1 is that, in an embodiment of the present application, the first light-emitting unit 30 is an OLED light-emitting unit, and the second light-emitting unit 40 is an LED chip.

In this case, the display panel 100 further includes the pixel definition layer 32. The first light-emitting unit 30 includes an anode 31, a light-emitting layer 33, and a cathode 34.

The planarization layer 11 is provided with a via hole 11a. The via hole 11a exposes a surface of the first source electrode 251 or the first drain electrode 252 away from the flexible substrate 10. The anode 31 is provided on the planarization layer 11. The anode 31 is connected to the first source electrode 251 or the first drain electrode 252 through the via hole 11a. The pixel definition layer 32 is disposed on the side of the anode 31 away from the flexible substrate 10. The pixel definition layer 32 has an opening 32a. The opening 32a exposes a surface of the anode 31 away from the flexible substrate 10. The light-emitting layer 33 is provided in the opening 32a. The cathode 34 is disposed on the side of the light-emitting layer 33 away from the flexible substrate 10. The cathode 34 may be arranged on the entire surface, or may be arranged in a pattern according to the requirements of the display panel 100.

The OLED light-emitting unit may further include one or more of a hole injection layer, a hole transport layer, an electron transport layer, and an electron injection layer. Specifically, the OLED light-emitting unit can be set according to the actual requirements of the display panel 100.

The light-emitting layer 33 of the OLED light-emitting unit may be made of an inorganic light-emitting material such as gallium nitride, quantum dots, or an organic light-emitting material. The OLED light-emitting unit may emit red light, blue light, green light, white light, or yellow light, and the like. When making an OLED light-emitting unit, different light-emitting materials can be selected according to different luminous color requirements.

It should be noted that the structure of the second light-emitting unit 40 and the connection relationship between the second light-emitting unit 40 and the driving circuit layer 20 are the same as the structure of the related layers in the display panel 100 shown in FIG. 1, and details are not repeated herein for brevity.

In an embodiment of the present application, the first light-emitting unit 30 is an OLED light-emitting unit, and the second light-emitting unit 40 is an LED chip, so that the structure of the display panel 100 is diversified.

Figure 5:
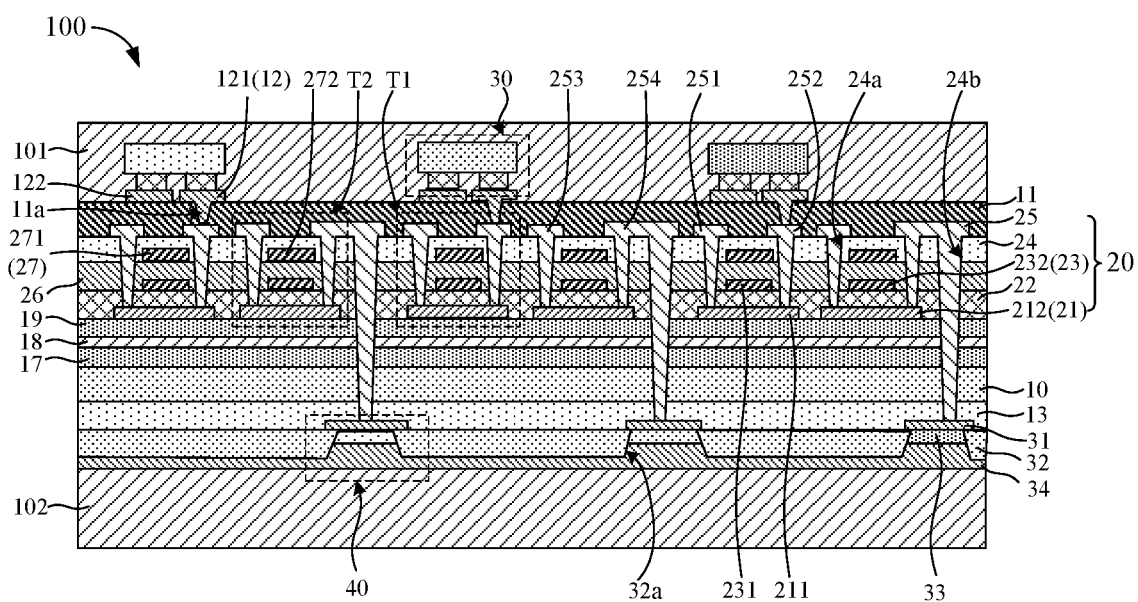
FIG. 5 is a fifth structural schematic diagram of the display panel provided by the present application.

Please refer to FIG. 5, which is a fifth structural schematic diagram of the display panel provided by the present application. The difference from the display panel 100 shown in FIG. 1 is that, in an embodiment of the present application, the first light-emitting unit 30 is an LED chip, and the second light-emitting unit 40 is an OLED light-emitting unit.

In this case, the display panel 100 further includes the pixel definition layer 32. The second light-emitting unit 40 includes an anode 31, a light-emitting layer 33, and a cathode 34.

The buffer layer 13 is disposed on the side of the flexible substrate 10 away from the driving circuit layer 20. The anode 31 is provided on the buffer layer 13. The anode 31 is connected to the second drain 254. The pixel definition layer 32 is disposed on the side of the anode 31 away from the flexible substrate 10. The pixel definition layer 32 has an opening 32a. The opening 32a exposes a surface of the anode 31 away from the flexible substrate 10. The light-emitting layer 33 is provided in the opening 32a. The cathode 34 is disposed on the side of the light-emitting layer 33 away from the flexible substrate 10.

It should be noted that the structure of the first light-emitting unit 30 and the connection relationship between the first light-emitting unit 30 and the driving circuit layer 20 are the same as the structure of the related layers in the display panel 100 shown in FIG. 1, and details will not be repeated herein for brevity.

Of course, in other embodiments of the present application, the first light-emitting unit 30 and the second light-emitting unit 40 may be both OLED light-emitting units. In this case, the specific structure of the display panel 100 can be obtained by combining the above-mentioned embodiments, and details will not be repeated herein for brevity.

In addition, the embodiment of the present application takes the display panel 100 shown in FIG. 1 as an example to describe the manufacturing method of the display panel 100. Specifically, the manufacturing method of the display panel 100 may include, but is not limited to, the following steps:

101. providing a rigid substrate, forming a substrate on the rigid substrate, and forming a third pad 141 and a fourth pad 142 on the substrate.

Specifically, the rigid substrate may be a glass substrate. A PI material can be coated on a glass substrate to form a substrate. A fourth metal layer 14 is then formed on the substrate. The fourth metal layer 14 includes third pads 141 and fourth pads 142.

102. forming a buffer layer 13, a flexible substrate 10, a protective layer 17, a first insulating layer 18, and a second insulating layer 19 on the substrate in sequence; and then, sequentially forming an active layer 21, a gate insulating layer 22, a first metal layer 23, an insulating layer 26, a fifth metal layer 27, and an interlayer insulating layer 24 on the second insulating layer 19.

The active layer 21 includes a first active layer 211 and a second active layer 212. The gate insulating layer 22 covers the active layer 21 and the second insulating layer 19. The first metal layer 23 includes a first gate electrode 231 and a second gate electrode 232 which are spaced apart from each other. The first gate 231 is disposed corresponding to the first active layer 211. The second gate electrode 232 is disposed corresponding to the second active layer 212. The fifth metal layer 27 includes a first electrode 271 and a second electrode 272. The first electrodes 271 is disposed corresponding to the first gate electrodes 231. The second electrode 272 is disposed corresponding to the second gate electrode 232.

103. etching the interlayer insulating layer 24 to form a plurality of contact holes 24a and connection holes 24b. Each contact hole 24a penetrates through the interlayer insulating layer 24 and extends to the side of the active layer 21 away from the flexible substrate 10. The contact hole 24a exposes a surface of the active layer 21 away from the flexible substrate 10. The connection hole 24b penetrates through the interlayer insulating layer 24 and extends to the third pad 141. The connection hole 24b exposes a surface of the third pad 141 away from the flexible substrate 10.

104. forming a second metal layer 25 on the interlayer insulating layer 24. The second metal layer 25 includes a first source electrode 251, a first drain electrode 252, a second source electrode 253, and a second drain electrode 254. The first source electrode 251 and the first drain electrode 252 are respectively connected to the first active layer 211. The second source electrode 253 and the second drain electrode 254 are respectively connected to the second active layer 212. The second source electrode 253 or the second drain electrode 254 is connected to the third pad 141 through the connection hole 24b.

Then, a planarization layer 11 is formed on the second metal layer 25. The planarization layer 11 is etched to form a via hole 11a. The via hole 11a exposes a surface of the first source electrode 251 or the first drain electrode 252 away from the flexible substrate 10. The third metal layer 12 is formed on the planarization layer 11. The third metal layer 12 includes a first pad 121 and a second pad 122. The first pad 121 is connected to the first source electrode 251 or the first drain electrode 252 through the via hole 11a.

105. bonding and connecting the LED chip to the first pad 121 and the second pad 122 by techniques such as mass transfer to form the first light-emitting unit 30. Then, a first encapsulation layer 101 is formed on the side of the first light-emitting unit 30 away from the flexible substrate 10.

106. peeling off and removing the hard substrate and the substrate by means of laser lift-off, mechanical lift-off, chemical solution immersion, etc., to expose surfaces of the third pad 141 and the fourth pad 142 on one side away from the flexible substrate 10.

107. flipping the semi-finished display panel made above, and bonding and connecting the LED chip to the third pad 141 and the fourth pad 142 through techniques such as mass transfer to form the second light-emitting unit 40. Then, a second encapsulation layer 102 is formed on the side of the second light-emitting unit 40 away from the flexible substrate 10.

It should be noted that, the above embodiments only describe the manufacturing process of the display panel 100 shown in FIG. 1. The display panels 100 described in other embodiments of the present application can be obtained by modifying one or more steps in the above-mentioned processes, and details are not repeated herein for brevity.

The display panel provided in the embodiments of the present application has been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising:
   a flexible substrate;
   a driving circuit layer disposed on the flexible substrate, wherein the driving circuit layer comprises a plurality of first transistors and a plurality of second transistors;
   a plurality of first light-emitting units disposed on a side of the driving circuit layer away from the flexible substrate, wherein each of the first light-emitting units is connected to a first source electrode or a first drain electrode of a corresponding one of the first transistors, and the first light-emitting units emit light from a side away from the flexible substrate; and
   a plurality of second light-emitting units disposed on a side of the flexible substrate away from the driving circuit layer, wherein each of the second light-emitting units is connected to a second source electrode or a second drain electrode of a corresponding one of the second transistors through a connection hole penetrating through the flexible substrate, and the second light-emitting units emit light from a side away from the flexible substrate, and
   wherein each of the first light-emitting units is an LED chip or an OLED light-emitting unit, each of the second light-emitting units is the LED chip or the OLED light-emitting unit, and at least one of the first light-emitting units is disposed between every adjacent two of the second light-emitting units.

2. The display panel according to claim 1, wherein, along a direction of the flexible substrate toward the first light-emitting units, the driving circuit layer comprises an active layer, a gate insulating layer, a first metal layer, an interlayer insulating layer, and a second metal layer; and
   wherein the active layer comprises a first active layer and a second active layer arranged spaced apart from each other, the first metal layer comprises a first gate electrode and a second gate electrode spaced apart from each other, the first gate electrode is disposed corresponding to the first active layer, the second gate electrode is disposed corresponding to the second active layer, and the second metal layer comprises the first source electrode, the first drain electrode, the second source electrode, and the second drain electrode, the first source electrode and the first drain electrode are respectively connected to the first active layer, and the second source electrode and the second drain electrode are respectively connected to the second active layer.

3. The display panel according to claim 2, wherein the interlayer insulating layer has a plurality of contact holes and the connection holes, each of the contact holes penetrates through the interlayer insulating layer and extends to the a side of the active layer away from the flexible substrate, each of the contact holes exposes a surface of the active layer on a side away from the flexible substrate, and each of the connection holes penetrates through the interlayer insulating layer and extends to the a side of the flexible substrate away from the driving circuit layer; and
   wherein the first source electrode and the first drain electrode are respectively connected to the first active layer through corresponding ones of the contact holes, the second source electrode and the second drain electrode are respectively connected to the second active layer through corresponding ones of the contact holes, and the second source electrode or the second drain electrode is connected to the second light-emitting units through the connection holes.

4. The display panel according to claim 1, wherein the first light-emitting units and the second light-emitting units are both LED chips, and the display panel further comprises a planarization layer, a third metal layer, a buffer layer, and a fourth metal layer; and
   wherein the planarization layer is disposed on a side of the second metal layer away from the flexible substrate, the planarization layer is provided with a via hole, the via hole exposes a surface the first source electrode or the first drain electrode on a side away from the flexible substrate, the third metal layer is disposed on the planarization layer, the third metal layer comprises a first pad and a second pad, the first pad is connected to the first source electrode or the first drain electrode through the via hole, each of the first light-emitting units is connected to the first pad and the second pad; the buffer layer is disposed on the flexible a side of the substrate away from the driving circuit layer, the fourth metal layer is disposed on a side of the buffer layer away from the flexible substrate, the fourth metal layer comprises a third pad and a fourth pad, the third pad is connected to the second source electrode or the second drain electrode, and each of the second light-emitting units is connected to the third pad and the fourth pad.

5. The display panel according to claim 4, wherein each of the LED chips comprises two connection electrodes, each of the first pad, the second pad, the third pad, and the fourth pad is respectively connected to a corresponding one of the connection electrodes through conductive glue or metal bonding.

6. The display panel according to claim 1, wherein the first light-emitting units are OLED light-emitting units, the second light-emitting units are LED chips, the display panel further comprises a planarization layer and a pixel definition layer, and each of the first light-emitting units comprises an anode, a light-emitting layer, and a cathode; and
   wherein the planarization layer is disposed on a side of the second metal layer away from the flexible substrate, the planarization layer is provided with a via hole, the via hole exposes a surface the first source electrode or the first drain electrode away from the flexible substrate, the anode is disposed on the planarization layer, the anode is connected to the first source electrode or the first drain electrode through the via hole, the pixel definition layer is disposed on a side of the anode away from the flexible substrate, the pixel definition layer has an opening, the opening exposes a surface of the anode on a side away from the flexible substrate, the light-emitting layer is disposed within the opening, and the cathode is disposed on a side of the light-emitting layer away from the flexible substrate.

7. The display panel according to claim 1, wherein the first light-emitting units are LED chips, the second light-emitting units are OLED light-emitting units, the display panel further comprises a buffer layer and a first pixel definition layer, and the second light-emitting units comprises an anode, a light-emitting layer, and a cathode; and
   wherein the buffer layer is disposed on the side of the flexible substrate away from the driving circuit layer, the anode is disposed on the buffer layer, and the anode is connected to the second source electrode or the second drain electrode through the connection holes, the pixel definition layer is disposed on a side of the anode away from the flexible substrate, the pixel definition layer has an opening, the opening exposes a surface of the anode on a side away from the flexible substrate, the light-emitting layer is arranged within the opening, and the cathode is disposed on a side of the light-emitting layer away from the flexible substrate.

8. The display panel according to claim 1, wherein two of the first light-emitting units are disposed between every adjacent two of the second light-emitting units.

9. A display panel, comprising:
a flexible substrate;
a driving circuit layer disposed on the flexible substrate, wherein the driving circuit layer comprises a first transistor and a second transistor;
a first light-emitting unit disposed on a side of the driving circuit layer away from the flexible substrate, wherein the first light-emitting unit is connected to a first source electrode or a first drain electrode of the first transistor, and the first light-emitting unit emits light from a side away from the flexible substrate; and
a second light-emitting unit disposed on the side of the flexible substrate away from the driving circuit layer, wherein the second light-emitting unit is connected to a second source electrode or a second drain electrode of the second transistor through a connection hole penetrating through the flexible substrate, and the second light-emitting unit emits light from a side away from the flexible substrate;
wherein, along a direction of the flexible substrate toward the first light-emitting units, the driving circuit layer comprises an active layer, a gate insulating layer, a first metal layer, an interlayer insulating layer, and a second metal layer; and
wherein the active layer comprises a first active layer and a second active layer arranged spaced apart from each other, the first metal layer comprises a first gate electrode and a second gate electrode spaced apart from each other, the first gate electrode is disposed corresponding to the first active layer, the second gate electrode is disposed corresponding to the second active layer, and the second metal layer comprises the first source electrode, the first drain electrode, the second source electrode, and the second drain electrode, the first source electrode and the first drain electrode are respectively connected to the first active layer, and the second source electrode and the second drain electrode are respectively connected to the second active layer;
wherein the interlayer insulating layer has a plurality of contact holes and the connection hole, each of the contact holes penetrates through the interlayer insulating layer and extends to the a side of the active layer away from the flexible substrate, each of the contact holes exposes a surface of the active layer on a side away from the flexible substrate, and the connection hole penetrates through the interlayer insulating layer and extends to the a side of the flexible substrate away from the driving circuit layer; and
wherein the first source electrode and the first drain electrode are respectively connected to the first active layer through corresponding ones of the contact holes, the second source electrode and the second drain electrode are respectively connected to the second active layer through corresponding ones of the contact holes, and the second source electrode or the second drain electrode is connected to each of the second light-emitting units through the connection hole.

10. The display panel according to claim 9, wherein the first light-emitting unit is an LED chip or an OLED light-emitting unit, and the second light-emitting unit is the LED chip or the OLED light-emitting unit.

11. The display panel according to claim 10, wherein the first light-emitting unit and the second light-emitting unit are both LED chips, and the display panel further comprises a planarization layer, a third metal layer, a buffer layer, and a fourth metal layer; and
wherein the planarization layer is disposed on a side of the second metal layer away from the flexible substrate, the planarization layer is provided with a via hole, the via hole exposes a surface the first source electrode or the first drain electrode on a side away from the flexible substrate, the third metal layer is disposed on the planarization layer, the third metal layer comprises a first pad and a second pad, the first pad is connected to the first source electrode or the first drain electrode through the via hole, the first light-emitting unit is connected to the first pad and the second pad; the buffer layer is disposed on a side of the flexible substrate away from the driving circuit layer, the fourth metal layer is disposed on a side of the buffer layer away from the flexible substrate, the fourth metal layer comprises a third pad and a fourth pad, the third pad is connected to the second source electrode or the second drain electrode, and the second light-emitting unit is connected to the third pad and the fourth pad.

12. The display panel according to claim 11, wherein each of the LED chips comprises two connection electrodes, each of the first pad, the second pad, the third pad, and the fourth pad are respectively connected to a corresponding one of the connection electrodes through conductive glue or metal bonding.

13. The display panel according to claim 10, wherein the first light-emitting unit is an OLED light-emitting unit, the second light-emitting unit is an LED chip, the display panel further comprises a planarization layer and a pixel definition layer, and the first light-emitting unit comprises an anode, a light-emitting layer, and a cathode; and
wherein the planarization layer is disposed on a side of the second metal layer away from the flexible substrate, the planarization layer is provided with a via hole, the via hole exposes a surface the first source electrode or the first drain electrode on a side away from the flexible substrate, the anode is disposed on the planarization layer, the anode is connected to the first source electrode or the first drain electrode through the via hole, the pixel definition layer is disposed on a side of the anode away from the flexible substrate, the pixel definition layer has an opening, the opening exposes a surface of the anode on a side away from the flexible substrate, the light-emitting layer is disposed within the opening, and the cathode is disposed on a side of the light-emitting layer away from the flexible substrate.

14. The display panel according to claim 10, wherein the first light-emitting unit is an LED chip, the second light-emitting unit is an OLED light-emitting unit, the display panel further comprises a buffer layer and a first pixel definition layer, and the second light-emitting unit comprises an anode, a light-emitting layer, and a cathode; and
wherein the buffer layer is disposed on the side of the flexible substrate away from the driving circuit layer, the anode is disposed on the buffer layer, and the anode is connected to the second source electrode or the second source electrode through the connection hole, the pixel definition layer is disposed on a side of the anode away from the flexible substrate, the pixel definition layer has an opening, the opening exposes a surface of the anode on a side away from the flexible substrate, the light-emitting layer is arranged within the opening, and the cathode is disposed on a side of the light-emitting layer away from the flexible substrate.

15. The display panel according to claim 9, wherein the driving circuit layer further comprises an insulating layer and a fifth metal layer; and
  wherein the insulating layer is disposed on a side of the first metal layer away from the flexible substrate, the fifth metal layer is arranged between the insulating layer and the interlayer insulating layer, the fifth metal layer is disposed between the insulating layer and the interlayer insulating layer, the fifth metal layer comprises a first electrode and a second electrode, the first electrode is disposed corresponding to the first gate electrode, and the second electrode is disposed corresponding to the second gate electrode.

16. The display panel according to claim 9, wherein the display panel further comprises a protective layer, a first insulating layer, a second insulating layer, a first encapsulation layer, and a second encapsulation layer; and
  wherein, along a direction of the flexible substrate toward the first light-emitting unit, the protective layer, the first insulating layer, and the second insulating layer are sequentially stacked between the flexible substrate and the driving circuit layer; the first encapsulation layer is disposed on the side of the first light-emitting unit away from the flexible substrate and covers the first light-emitting unit, and the second encapsulation layer is disposed on the side of the second light-emitting unit away from the flexible substrate and covers the second light-emitting unit.

17. The display panel according to claim 9, wherein the display panel comprises a plurality of the first light-emitting units and a plurality of the second light-emitting units, and the driving circuit layer comprises a plurality of the first transistors and a plurality of the second transistors, each of the first transistors is connected to at least one of the first light-emitting units, and each of the second transistors is connected to at least one of the second light-emitting units.

18. The display panel according to claim 17, wherein the plurality of the first light-emitting units are arranged in an array, the plurality of the second light-emitting units are arranged in an array, and at least one of the first light-emitting units are disposed between every adjacent two of the second light-emitting units.

19. A display panel, comprising:
  a flexible substrate;
  a driving circuit layer disposed on the flexible substrate, wherein the driving circuit layer comprises a first transistor and a second transistor;
  a first light-emitting unit disposed on a side of the driving circuit layer away from the flexible substrate, wherein the first light-emitting unit is connected to a first source electrode or a first drain electrode of the first transistor, and the first light-emitting unit emits light from a side away from the flexible substrate; and
  a second light-emitting unit disposed on the side of the flexible substrate away from the driving circuit layer, wherein the second light-emitting unit is connected to a second source electrode or a second drain electrode of the second transistor through a connection hole penetrating through the flexible substrate, and the second light-emitting unit emits light from a side away from the flexible substrate;
  wherein the display panel comprises a plurality of the first light-emitting units and a plurality of the second light-emitting units, and the driving circuit layer comprises a plurality of the first transistors and a plurality of the second transistors, each of the first transistors is connected to at least one of the first light-emitting units, and each of the second transistors is connected to at least one of the second light-emitting units;
  wherein the plurality of the first light-emitting units are arranged in an array, the plurality of the second light-emitting units are arranged in an array, and at least one of the first light-emitting units are disposed between every adjacent two of the second light-emitting units.

* * * * *